US009824903B2

United States Patent
Ishibashi

(10) Patent No.: US 9,824,903 B2
(45) Date of Patent: Nov. 21, 2017

(54) SUBSTRATE CLEANING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 702 days.

(21) Appl. No.: 14/260,220

(22) Filed: Apr. 23, 2014

(65) Prior Publication Data
US 2014/0331440 A1 Nov. 13, 2014

(30) Foreign Application Priority Data

Apr. 25, 2013 (JP) .................................. 2013-092182

(51) Int. Cl.
*B08B 11/02* (2006.01)
*H01L 21/67* (2006.01)

(52) U.S. Cl.
CPC ........ *H01L 21/67046* (2013.01); *B08B 11/02* (2013.01); *H01L 21/67051* (2013.01)

(58) Field of Classification Search
CPC ........... B08B 1/007; B08B 1/04; B08B 11/02; H01L 21/67046
See application file for complete search history.

(56) References Cited

U.S. PATENT DOCUMENTS

| 6,059,891 A * | 5/2000 | Kubota | B08B 1/007 134/1.3 |
| 6,158,075 A * | 12/2000 | Tanaka | B08B 1/007 134/6 |
| 2002/0189641 A1 * | 12/2002 | Sato | B08B 1/04 134/6 |

FOREIGN PATENT DOCUMENTS

| JP | 2005-12238 | 1/2005 |
| JP | 2001-121096 A | 5/2011 |
| JP | 2011-165751 A | 8/2011 |

* cited by examiner

*Primary Examiner* — Randall Chin
(74) *Attorney, Agent, or Firm* — Baker & Hostetler LLP

(57) ABSTRACT

A substrate cleaning apparatus including a self-cleaning device is disclosed. The substrate cleaning apparatus includes a self-cleaning device configured to clean a cylindrical scrub-cleaning tool that is rubbed against a substrate surface. The self-cleaning device includes a cleaning body having an inner circumferential surface that is shaped along an circumferential surface of the scrub-cleaning tool, and at least one cleaning nozzle configured to eject a cleaning fluid toward the circumferential surface of the scrub-cleaning tool through a gap between the circumferential surface of the scrub-cleaning tool and the inner circumferential surface of the cleaning body.

11 Claims, 16 Drawing Sheets

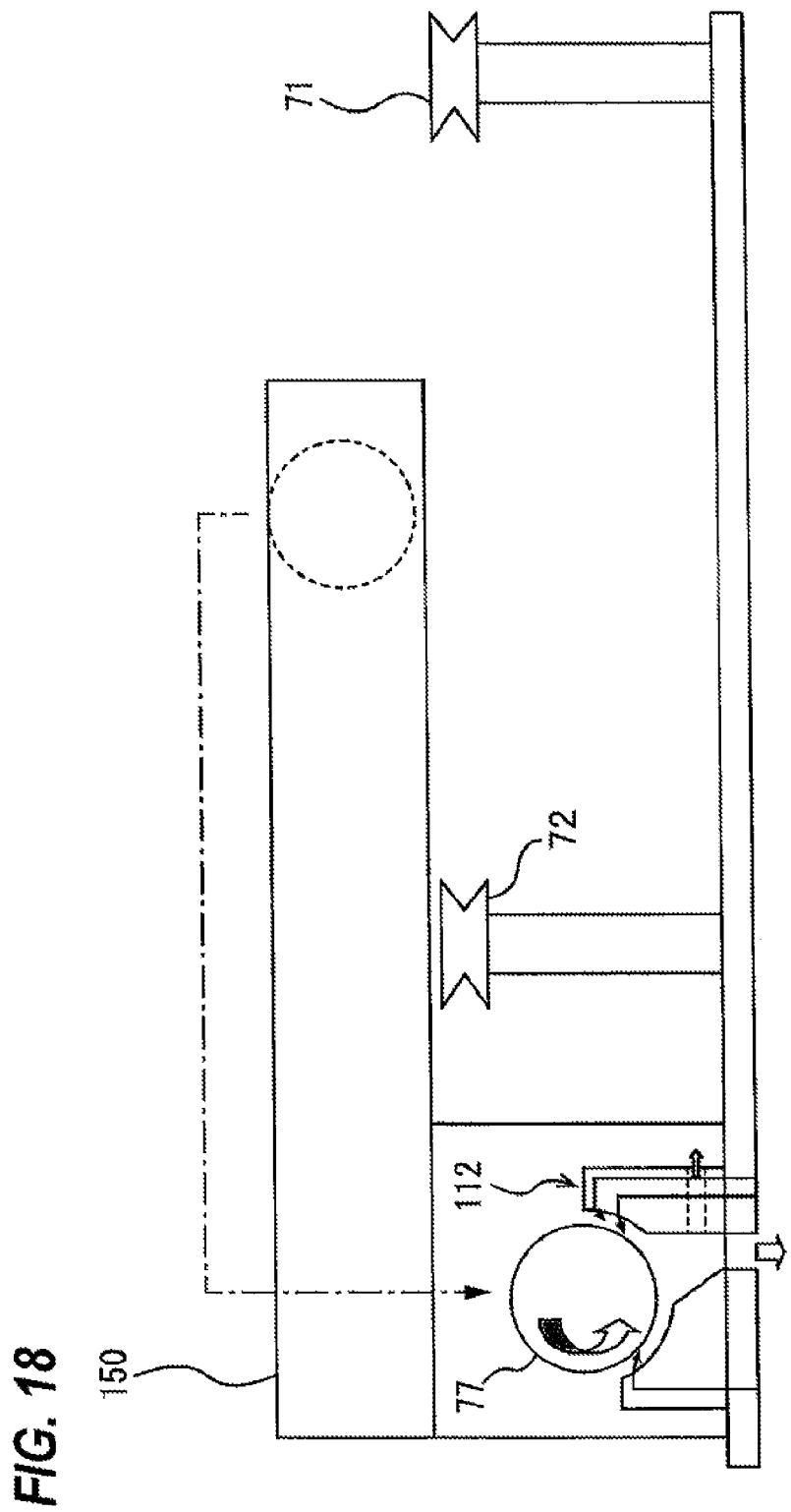

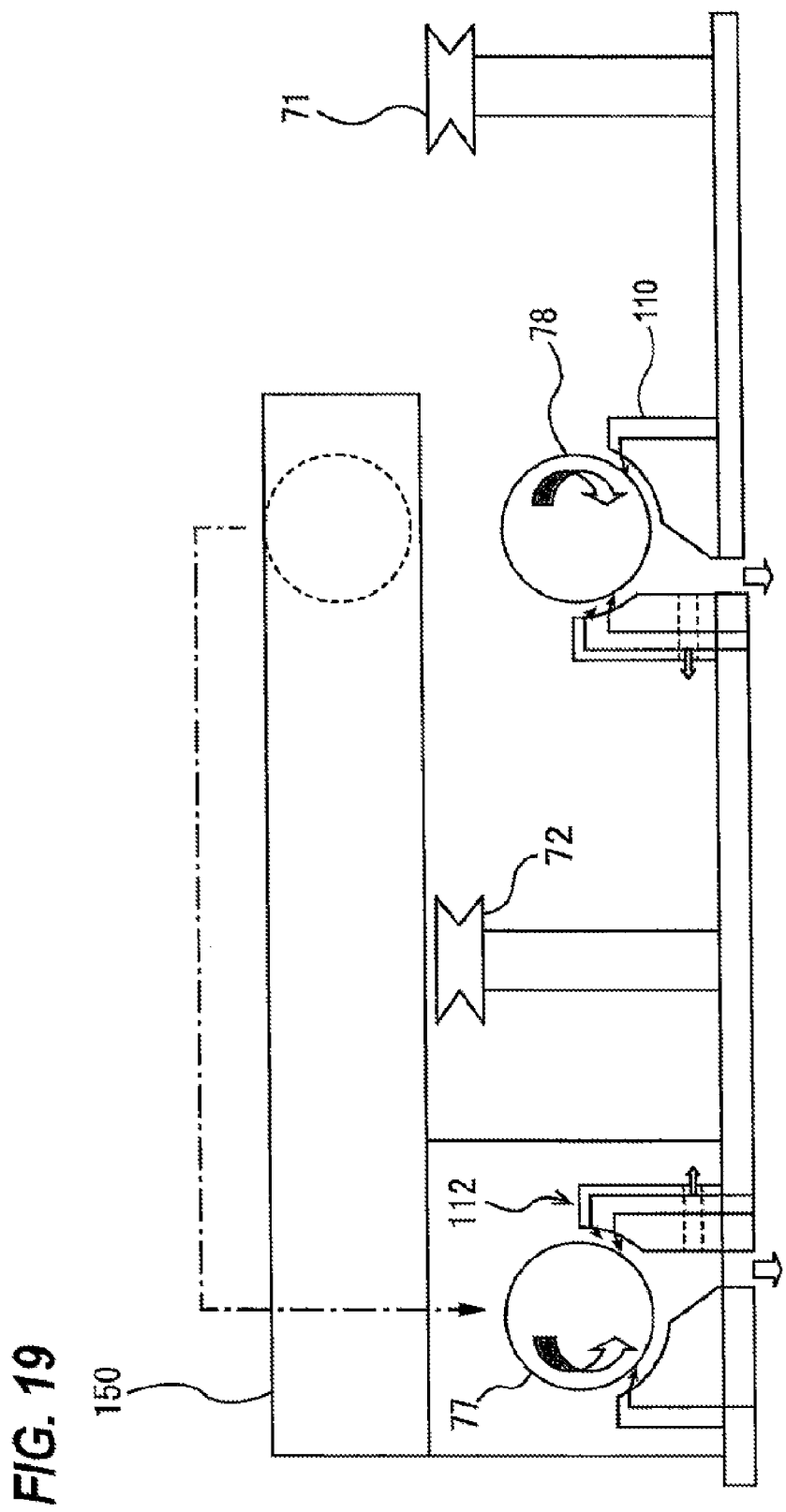

SUBSTRATE CLEANING APPARATUS

CROSS REFERENCE TO RELATED APPLICATION

This document claims priority to Japanese Patent Application Number 2013-092182 filed Apr. 25, 2013, the entire contents of which are hereby incorporated by reference.

BACKGROUND

In a manufacturing process of a semiconductor device, various films having different physical properties are formed on a silicon substrate and these films are subjected to various processes, thus forming fine metal interconnects. For example, in a damascene interconnect forming process, interconnect trenches are formed in a film and are then filled with metal, such as Cu. Thereafter, an excessive metal is removed by chemical mechanical polishing (CMP), so that metal interconnects are formed. A CMP apparatus (polishing apparatus) for polishing a substrate typically includes a substrate cleaning apparatus for cleaning a polished substrate. Cleaning of the substrate is performed by rubbing a scrub-cleaning tool, such as a roll sponge, against the substrate while rotating the substrate horizontally.

As the scrub-cleaning tool cleans substrate(s), abrasive grains used in CMP and polishing debris (hereinafter, these will collectively be referred to as processing debris) are accumulated in the scrub-cleaning tool. Therefore, in order to remove these processing debris from the scrub-cleaning tool, cleaning of the scrub-cleaning tool is periodically performed. Cleaning of the scrub-cleaning tool is performed by a self-cleaning device disposed adjacent to the substrate cleaning apparatus. More specifically, the scrub-cleaning tool is transported to the self-cleaning device after cleaning the substrate, and is then cleaned by a brush or a plate that contacts the scrub-cleaning tool, while the scrub-cleaning tool is rotated (see Japanese laid-open patent publication No. 2005-12238).

However, this conventional contact-type self-cleaning device has a problem that the processing debris that has been once removed is transferred from the brush or plate to the scrub-cleaning tool, thus causing back contamination of the scrub-cleaning tool and the substrate.

SUMMARY OF THE INVENTION

It is therefore an object to provide a substrate cleaning apparatus including a self-cleaning device that can clean a scrub-cleaning tool without causing back contamination of the scrub-cleaning tool and a substrate.

Embodiments, which will be described below, relate to a substrate cleaning apparatus for cleaning a substrate, such as a wafer, with use of a scrub-cleaning tool, and in particular relates to a substrate cleaning apparatus having a self-cleaning device for cleaning the scrub-cleaning tool.

In order to achieve the above-described object, an embodiment provides a substrate cleaning apparatus comprising: a substrate holder configured to hold and rotate a substrate; a cylindrical scrub-cleaning tool configured to come into sliding contact with a surface of the substrate; a rotating device configured to rotate the scrub-cleaning tool about its own axis; and a self-cleaning device configured to clean the scrub-cleaning tool, the self-cleaning device including a cleaning body having an inner circumferential surface that is shaped along an circumferential surface of the scrub-cleaning tool, and at least one cleaning nozzle configured to eject a cleaning fluid toward the circumferential surface of the scrub-cleaning tool through a gap between the circumferential surface of the scrub-cleaning tool and the inner circumferential surface of the cleaning body.

In an embodiment, the at least one cleaning nozzle comprises a first cleaning nozzle and a second cleaning nozzle disposed at both sides of the scrub-cleaning tool.

In an embodiment, the cleaning nozzle comprises a plurality of slit nozzles arranged along a central axis of the scrub-cleaning tool.

In an embodiment, the self-cleaning device further includes a blow nozzle configured to eject a gas toward the circumferential surface of the scrub-cleaning tool through the gap, the blow nozzle being disposed downstream of the cleaning nozzle with respect to a rotational direction of the scrub-cleaning tool.

In an embodiment, the cleaning nozzle is inclined downwardly.

In an embodiment, the cleaning fluid comprises a mixture of a cleaning liquid and a high-pressure gas.

In an embodiment, the cleaning fluid comprises a high-pressure cleaning liquid.

In an embodiment, the self-cleaning device further includes a suction passage for sucking a gas from the gap.

In an embodiment, the self-cleaning device further includes a drain having a fluid inlet lying in the inner circumferential surface of the cleaning body.

In an embodiment, the at least one cleaning nozzle comprises a first cleaning nozzle and a second cleaning nozzle disposed at both sides of the scrub-cleaning tool, a third cleaning nozzle disposed below the first cleaning nozzle, and a fourth cleaning nozzle disposed below the second cleaning nozzle.

In an embodiment, the scrub-cleaning tool is disposed so as to come into sliding contact with a lower surface of the substrate, and the self-cleaning device is disposed below the scrub-cleaning tool.

In an embodiment, the substrate cleaning apparatus further comprises a transporting mechanism configured to transport the scrub-cleaning tool to the self-cleaning device, the scrub-cleaning tool being disposed so as to come into sliding contact with an upper surface of the substrate, and the self-cleaning device being disposed adjacent to the substrate holder.

According to the above-described embodiments, the jet flow of the cleaning fluid impinges on the circumferential surface of the scrub-cleaning tool to thereby clean the scrub-cleaning tool. Since the scrub-cleaning tool is cleaned in a non-contact manner, the back contamination of the scrub-cleaning tool and the substrate does not occur, unlike a conventional contact-type self-cleaning device which uses a brush or plate. The self-cleaning device can be disposed immediately below the scrub-cleaning tool. With this arrangement, it is not necessary to transport the scrub-cleaning tool, and therefore a throughput of the substrate processing as a whole can be improved.

BRIEF DESCRIPTION OF THE DRAWINGS

FIG. 18 is a schematic view showing a substrate cleaning apparatus including a self-cleaning device for cleaning an upper roll sponge; and FIG. 19 is a schematic view showing a substrate cleaning apparatus including the self-cleaning device for cleaning the upper roll sponge in addition to the self-cleaning device for cleaning a lower roll sponge.

DETAILED DESCRIPTION OF EMBODIMENTS

Embodiments will be described below with reference to the drawings.

Figure 1:
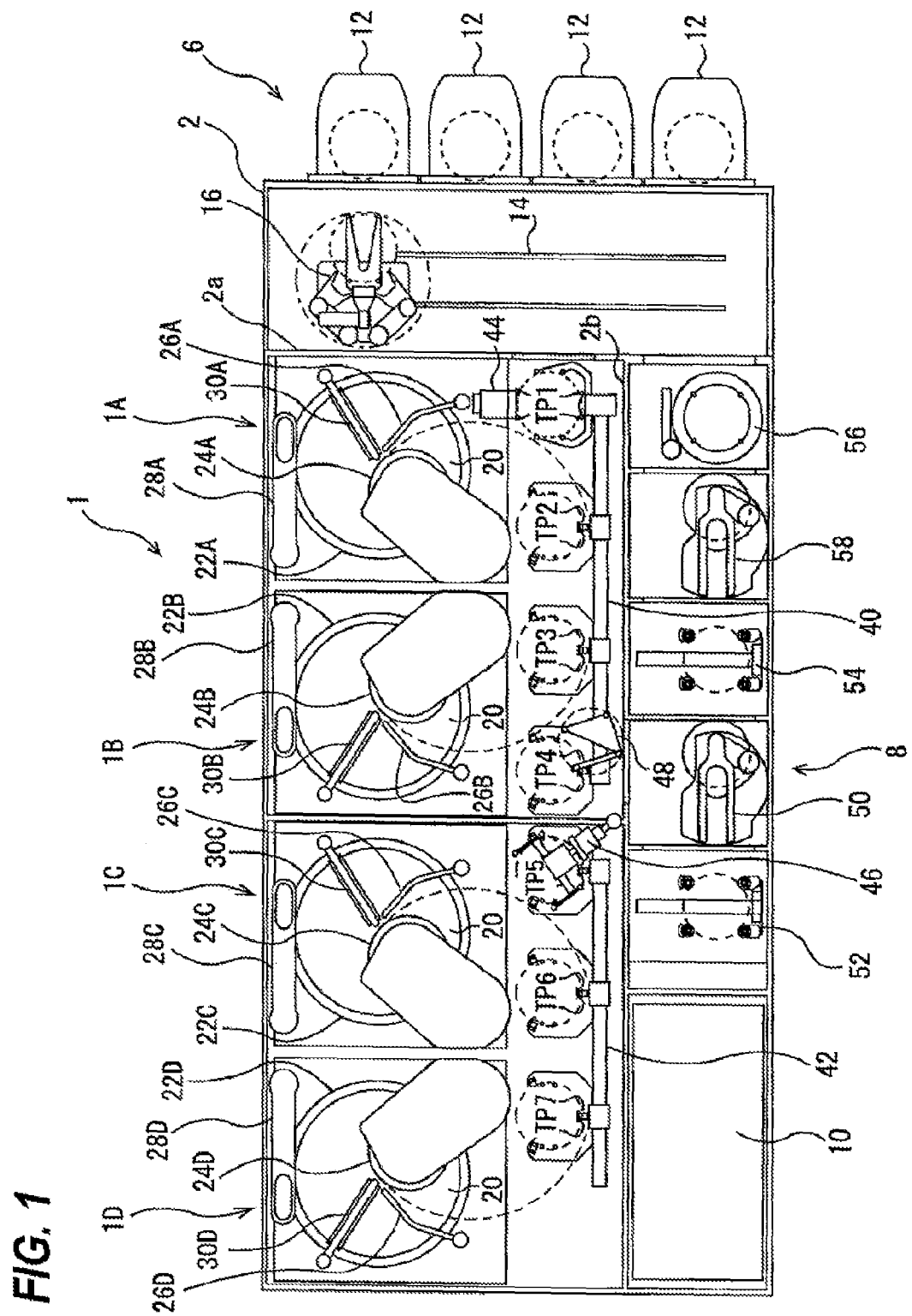
FIG. 1 is a diagram showing a polishing apparatus provided with polishing units, cleaning units, and a drying unit.

FIG. 1 is a view showing a polishing apparatus having polishing units, cleaning units, and a drying unit. This polishing apparatus is a device capable of performing a series of processes including polishing, cleaning, and drying of a wafer (a substrate). As shown in FIG. 1, the polishing apparatus has a housing 2 in approximately a rectangular shape. An interior space of the housing 2 is divided by partitions 2a, 2b into a load-unload section 6, a polishing section 1, and a cleaning section 8. The polishing apparatus includes an operation controller 10 configured to control wafer processing operations.

The load-unload section 6 has load ports 12 on which wafer cassettes are placed, respectively. A plurality of wafers are stored in each wafer cassette. The load-unload section 6 has a moving mechanism 14 extending along an arrangement direction of the load ports 12. A transfer robot (loader) 16 is provided on the moving mechanism 14, so that the transfer robot 16 can move along the arrangement direction of the wafer cassettes. The transfer robot 16 moves on the moving mechanism 14 so as to access the wafer cassettes mounted to the load ports 12.

The polishing section 1 is an area where a wafer is polished. This polishing section 1 includes a first polishing unit 1A, a second polishing unit 1B, a third polishing unit 1C, and a fourth polishing unit 1D. The first polishing unit 1A includes a first polishing table 22A to which a polishing pad 20, having a polishing surface, is attached, a first top ring 24A for holding a wafer and pressing the wafer against the polishing pad 20 on the first polishing table 22A so as to polish the wafer, a first polishing liquid supply nozzle 26A for supplying a polishing liquid (e.g., slurry) and a dressing liquid (e.g., pure water) onto the polishing pad 20, a first dressing unit 28A for dressing the polishing surface of the polishing pad 20, and a first atomizer 30A for ejecting a mixture of a liquid (e.g., pure water) and a gas (e.g., nitrogen gas) or a liquid (e.g., pure water), in an atomized state, onto the polishing surface of the polishing pad 20.

Similarly, the second polishing unit 1B includes a second polishing table 22B to which a polishing pad 20 is attached, a second top ring 24B, a second polishing liquid supply nozzle 26B, a second dressing unit 28B, and a second atomizer 30B. The third polishing unit 1C includes a third polishing table 22C to which a polishing pad 20 is attached, a third top ring 24C, a third polishing liquid supply nozzle 26C, a third dressing unit 28C, and a third atomizer 30C. The fourth polishing unit 1D includes a fourth polishing table 22D to which a polishing pad 20 is attached, a fourth top ring 24D, a fourth polishing liquid supply nozzle 26D, a fourth dressing unit 28D, and a fourth atomizer 30D.

A first linear transporter 40 is disposed adjacent to the first polishing unit 1A and the second polishing unit 1B. The first linear transporter 40 is a mechanism for transporting a wafer between four transfer positions (i.e., a first transfer position TP1, a second transfer position TP2, a third transfer position TP3 and a fourth transfer position TP4). A second linear transporter 42 is disposed adjacent to the third polishing unit 1C and the fourth polishing unit 1D. The second linear transporter 42 is a mechanism for transporting a wafer between three transfer positions (i.e., a fifth transfer position TP5, a sixth transfer position TP6, and a seventh transfer position TP7).

A lifter 44 for receiving the wafer from the transfer robot 16 is disposed adjacent to the first transfer position TP1. The wafer is transported from the transfer robot 16 to the first linear transporter 40 via the lifter 44. A shutter (not shown) is provided on the partition 2a. This shutter is located between the lifter 44 and the transfer robot 16. When the wafer is to be transported, the shutter is opened to allow the transfer robot 16 to transport the wafer to the lifter 44.

The wafer is transported to the lifter 44 by the transfer robot 16, then transported from the lifter 44 to the first linear transporter 40, and further transported to the polishing units 1A, 1B by the first linear transporter 40. The top ring 24A of the first polishing unit 1A is movable between a position above the first polishing table 22A and the second transfer position TP2 by a swing motion of the top ring 24A. Therefore, the wafer is transferred to and from the top ring 24A at the second transfer position TP2.

Similarly, the top ring 24B of the second polishing unit 1B is movable between a position above the polishing table 22B and the third transfer position TP3, and the wafer is transferred to and from the top ring 24B at the third transfer position TP3. The top ring 24C of the third polishing unit 1C is movable between a position above the polishing table 22C and the sixth transfer position TP6, and the wafer is transferred to and from the top ring 24C at the sixth transfer position TP6. The top ring 24D of the fourth polishing unit 1D is movable between a position above the polishing table 22D and the seventh transfer position TP7, and the wafer is transferred to and from the top ring 24D at the seventh transfer position TP7.

A swing transporter 46 is provided between the first linear transporter 40, the second linear transporter 42, and the cleaning section 8. Transporting of the wafer from the first linear transporter 40 to the second linear transporter 42 is performed by the swing transporter 46. The wafer is transported to the third polishing unit 1C and/or the fourth polishing unit 1D by the second linear transporter 42.

A temporary stage 48 for the wafer W is disposed beside the swing transporter 46. This temporary stage 48 is mounted to a non-illustrated frame. As shown in FIG. 1, the temporary stage 48 is disposed adjacent to the first linear transporter 40 and located between the first linear transporter 40 and the cleaning section 8. The swing transporter 46 is configured to transport the wafer between the fourth transfer position TP4, the fifth transfer position TP5, and the temporary stage 48.

The wafer, once placed on the temporary stage 48, is transported to the cleaning section 8 by a first transfer robot 50 of the cleaning section 8. The cleaning section 8 includes a first cleaning unit 52 and a second cleaning unit 54 each for cleaning the polished wafer with a cleaning liquid, and a drying unit 56 for drying the cleaned wafer. The first transfer robot 50 is operable to transport the wafer from the temporary stage 48 to the first cleaning unit 52 and further transport the wafer from the first cleaning unit 52 to the second cleaning unit 54. A second transfer robot 58 is disposed between the second cleaning unit 54 and the drying unit 56. This second transfer robot 58 is operable to transport the wafer from the second cleaning unit 54 to the drying unit 56.

The dried wafer is removed from the drying unit 56 and returned to the wafer cassette by the transfer robot 16. In this manner, a series of processes including polishing, cleaning, and drying of the wafer is performed.

Figure 2:
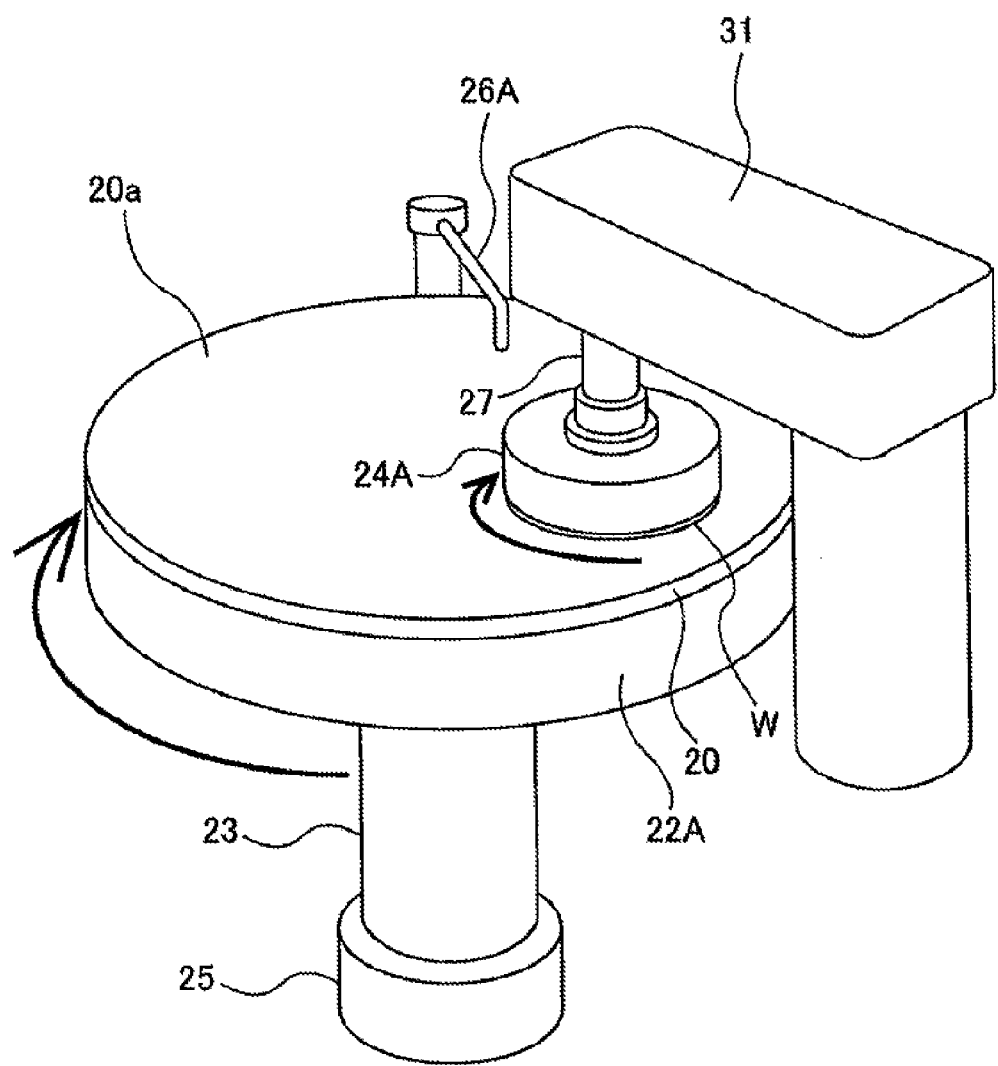
FIG. 2 is a perspective view of a first polishing unit.

The first polishing unit 1A, the second polishing unit 1B, the third polishing unit 1C, and the fourth polishing unit 1D have the same structure as each other. Therefore, the first polishing unit 1A will be described below. FIG. 2 is a schematic perspective view showing the first polishing unit 1A. As shown in FIG. 2, the first polishing unit 1A includes the polishing table 22A supporting the polishing pad 20, the top ring 24A for pressing the wafer W against the polishing pad 20, and the polishing liquid supply nozzle 26A for supplying the polishing liquid (e.g., slurry) onto the polishing pad 20. In FIG. 2, illustration of the first dressing unit 28A and the first atomizer 30A is omitted.

The polishing table 22A is coupled via a table shaft 23 to a table motor 25 disposed below the polishing table 22A, so that the polishing table 22A is rotated by the table motor 25 in a direction indicated by arrow. The polishing pad 20 is attached to an upper surface of the polishing table 22A. The polishing pad 20 has an upper surface, which provides a polishing surface 20a for polishing the wafer W. The top ring 24A is secured to a lower end of a top ring shaft 27. The top ring 24A is configured to be able to hold the wafer W on its lower surface by vacuum suction. The top ring shaft 27 is coupled to a rotating device (not shown) disposed in a top ring arm 31, so that the top ring 24A is rotated by the rotating device through the top ring shaft 27.

Polishing of the surface of the wafer W is performed as follows. The top ring 24A and the polishing table 22A are rotated in respective directions indicated by arrows, and the polishing liquid (e.g., the slurry) is supplied from the polishing liquid supply nozzle 26A onto the polishing pad 20. In this state, the wafer W is pressed against the polishing surface 20a of the polishing pad 20 by the top ring 24A. The surface of the wafer W is polished by a mechanical action of abrasive grains contained in the polishing liquid and a chemical action of a chemical component contained in the polishing liquid.

Figure 3:
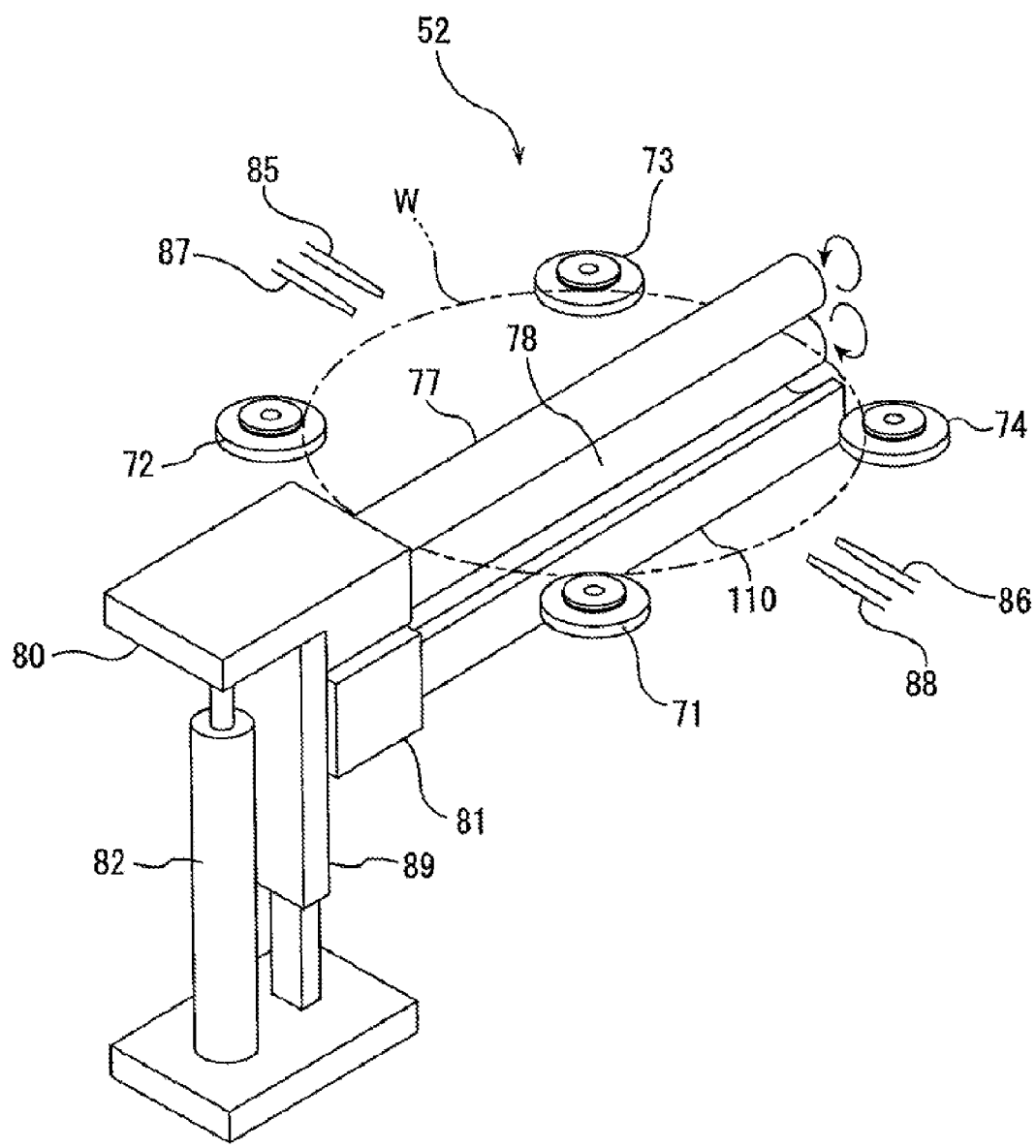
FIG. 3 is a perspective view of a first cleaning unit (a substrate cleaning apparatus)

The first cleaning unit 52 and the second cleaning unit 54 have the same structure as each other. Therefore, the first cleaning unit 52 will be described below. FIG. 3 is a perspective view showing the first cleaning unit (substrate cleaning apparatus) 52. As shown in FIG. 3, the first cleaning unit 52 includes four holding rollers (i.e., a substrate holder) 71, 72, 73, 74 for holding and rotating the wafer W horizontally, cylindrical roll sponges (i.e., scrub-cleaning tools) 77, 78 configured to contact upper and lower surfaces of the wafer W, respectively, rotating devices 80, 81 for rotating the roll sponges 77, 78, upper pure water supply nozzles 85, 86 for supplying pure water (preferably, ultra-pure water) onto the upper surface of the wafer W, and upper cleaning liquid supply nozzles 87, 88 for supplying a cleaning liquid (chemical liquid) onto the upper surface of the wafer W. Although not shown in FIG. 3, lower pure water supply nozzles for supplying pure water onto the lower surface (the surface on which a structure, such as a dielectric film, a metallic film, or a device including a dielectric film and a metallic film is formed) of the wafer W, and lower cleaning liquid supply nozzles for supplying a cleaning liquid (chemical liquid) onto the lower surface of the wafer W are provided.

The holding rollers 71, 72, 73, 74 are movable in directions closer to and away from the wafer W by a non-illustrated moving mechanism (e.g., an air cylinder). The rotating device 80, which is configured to rotate the upper roll sponge 77, is mounted to a guide rail 89 that guides a vertical movement of the rotating device 80. This rotating device 80 is supported by an elevating device 82 so that the rotating device 80 and the upper roll sponge 77 are moved in the vertical direction by the elevating device 82. Although not shown in FIG. 3, the rotating device 81, which is configured to rotate the lower roll sponge 78, is also mounted to a guide rail. The rotating device 81 and the lower roll sponge 78 are moved vertically by an elevating device (not shown). A motor-drive mechanism employing a ball screw, an air cylinder, or the like is used as the elevating device. When the wafer W is to be cleaned, the roll sponges 77, 78 are moved closer to each other until the roll sponges 77, 78 contact the upper and lower surfaces of the wafer W, respectively. Instead of the roll sponge, a roll brush may be used as the scrub-cleaning tool.

A process of cleaning the wafer W will now be described. First, the wafer W is started rotating about its axis. Next, the cleaning liquid is supplied from the upper cleaning liquid supply nozzles 87, 88 and the not-shown lower cleaning liquid supply nozzles onto the upper surface and the lower surface of the wafer W. While the wafer W is rotated and the cleaning liquid is supplied to the wafer W, the roll sponges 77, 78 are rotated about their horizontally-extending axes and come into sliding contact with the upper and lower surfaces of the wafer W to scrub the upper and lower surfaces of the wafer W.

After the scrub-cleaning of the wafer W, rinsing of the wafer W is performed by supplying the pure water onto the rotating wafer W. The rinsing of the wafer W may be performed while rubbing the roll sponges 77, 78 against the upper and lower surfaces of the wafer W or while keeping the roll sponges 77, 78 away from the upper and lower surfaces of the wafer W.

The wafer W that has been polished in the polishing section 1 is cleaned in the first cleaning unit 52 and the second cleaning unit 54 in the above-described manner. It is also possible to perform multi-step cleaning of a wafer with use of three or more cleaning units.

In the above-described first cleaning unit 52, the wafer is held by the holding rollers 71, 72, 73, 74, such that the surface, on which a structure (e.g., a device) is formed, faces downward. Since the lower roll sponge (scrub-cleaning tool) 78 is placed in sliding contact with the lower surface of the wafer W, processing debris, such as polishing debris and abrasive grains contained in the slurry, is accumulated on an circumferential surface of the roll sponge 78. Thus, in order to clean the circumferential surface of the roll sponge 78, a self-cleaning device 110 is disposed immediately below the lower roll sponge 78.

Figure 4:
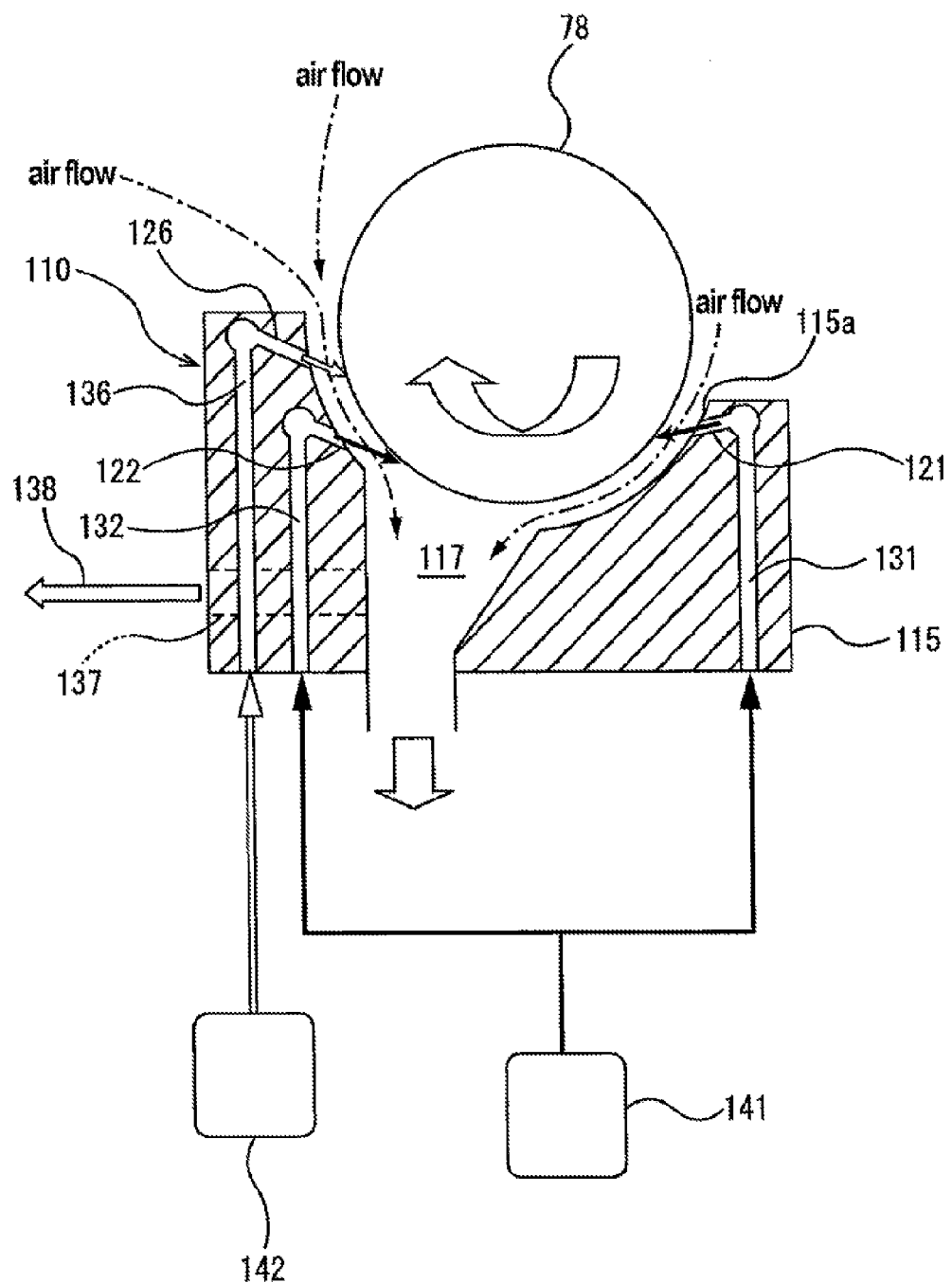
FIG. 4 is a cross-sectional view showing a self-cleaning device.

FIG. 4 is a cross-sectional view showing the self-cleaning device 110. The self-cleaning device 110 includes a cleaning body 115 extending along the roll sponge 78, and a first cleaning nozzle 121 and a second cleaning nozzle 122 which are provided in the cleaning body 115. The cleaning body 115 has an inner circumferential surface 115a that is shaped along the circumferential surface of the roll sponge 78. The inner circumferential surface 115a of the cleaning body 115 has a semicylindrical shape, and is disposed so as to face a lower half of the circumferential surface of the roll sponge 78. The inner circumferential surface 115a of the cleaning body 115 has a slightly larger diameter than a diameter of the roll sponge 78. The first cleaning nozzle 121 and the second cleaning nozzle 122 have open ends, respectively, lying in the inner circumferential surface 115a of the cleaning body 115. The first cleaning nozzle 121 and the second cleaning nozzle 122 are configured to eject cleaning fluid toward the circumferential surface of the roll sponge 78 through a gap formed between the circumferential surface of the roll sponge 78 and the inner circumferential surface 115a of the cleaning body 115.

The first cleaning nozzle 121 and the second cleaning nozzle 122 are disposed at both sides of the roll sponge 78. More specifically, the first cleaning nozzle 121 is disposed upstream of the second cleaning nozzle 122 with respect to a rotational direction of the roll sponge 78. Each of the first cleaning nozzle 121 and the second cleaning nozzle 122 is constituted by a plurality of slit-nozzles which are arranged along a central axis (axial direction) of the roll sponge 78. The first cleaning nozzle 121 is coupled to a first fluid passage 131, and the second cleaning nozzle 122 is coupled a second fluid passage 132. The first fluid passage 131 and the second fluid passage 132 are coupled to a cleaning fluid supply source 141.

The cleaning fluid is supplied from the cleaning fluid supply source 141 through the fluid passages 131, 132 to the cleaning nozzles 121, 122, and is then supplied as fluid jet from the cleaning nozzles 121, 122 onto the circumferential surface of the roll sponge 78. The cleaning fluid may be a mixture of a cleaning liquid (e.g., pure water) and a high-pressure gas (e.g., high-pressure nitrogen gas), or a high-pressure cleaning liquid (e.g., high-pressure pure water). Therefore, a two-fluid jet or a liquid jet is supplied onto the circumferential surface of the roll sponge 78 from each of the first cleaning nozzle 121 and the second cleaning nozzle 122.

A blow nozzle 126, which ejects a gas composed of an inert gas (e.g., nitrogen gas) or an air onto the circumferential surface of the roll sponge 78, is disposed above the second cleaning nozzle 122. The blow nozzle 126 is disposed downstream of the second cleaning nozzle 122 with respect to the rotational direction of the roll sponge 78. The blow nozzle 126 is provided in the cleaning body 115, and is coupled to a gas supply source 142 via a gas passage 136.

The blow nozzle 126 has open end(s) lying in the inner circumferential surface 115a of the cleaning body 115, as with the cleaning nozzles 121, 122, and is configured to eject the high-pressure gas toward the circumferential surface of the roll sponge 78 through the gap between the circumferential surface of the roll sponge 78 and the inner circumferential surface 115a of the cleaning body 115.

The first cleaning nozzle 121 and the second cleaning nozzle 122 are disposed below the central axis of the roll sponge 78. The cleaning nozzles 121, 122 are inclined downwardly with respect to a horizontal direction, and eject the cleaning fluid in a diagonally downward direction toward the circumferential surface of the roll sponge 78. The cleaning fluid impinges on a lower part of the circumferential surface of the roll sponge 78 at an acute angle to thereby clean the roll sponge 78. The cleaning fluid flows downwardly in the gap between the circumferential surface of the roll sponge 78 and the inner circumferential surface 115a of the cleaning body 115 and is discharged through a drain 117 communicating with this gap. The drain 117 is provided in the cleaning body 115 and has a fluid inlet lying in the inner circumferential surface 115a of the cleaning body 115.

As with the cleaning nozzles 121, 122, the blow nozzle 126 is disposed below the central axis of the roll sponge 78. The blow nozzle 126 is inclined downwardly with respect to the horizontal direction, and ejects the gas in a diagonally downward direction toward the circumferential surface of the roll sponge 78. The gas impinges on the lower part of the circumferential surface of the roll sponge 78 at an acute angle to thereby remove the cleaning fluid from the roll sponge 78. The gas moves in the gap between the circumferential surface of the roll sponge 78 and the inner circumferential surface 115a of the cleaning body 115 in a direction against the rotational direction of the roll sponge 78 and is then discharged through the drain 117.

A suction passage 137, branching off from the drain 117, is provided in the cleaning body 115. This suction passage 137 is coupled to a vacuum-exhaust line 138 having a vacuum source, such as a vacuum pump, so that the suction passage 137 can suck the gas from the gap between the circumferential surface of the roll sponge 78 and the inner circumferential surface 115a of the cleaning body 115 through the drain 117. Therefore, as shown in FIG. 4, air surrounding the roll sponge 78 is drawn into the gap, thereby forming downward flow. This downward flow can prevent the cleaning fluid from being scattered, and can also prevent the processing debris (e.g., abrasive grains and polishing debris), which has been removed from the roll sponge 78, from adhering to the roll sponge 78 again.

Cleaning of the roll sponge 78 is performed while rotating the roll sponge 78. A rotational speed of the roll sponge 78 when being cleaned is preferably within a range of 5 $min^{-1}$ to 50 $min^{-1}$, more preferably within a range of 5 $min^{-1}$ to 10 $min^{-1}$, under a condition that the diameter of the roll sponge 78 is less than or equal to 100 mm. Every time the roll sponge 78 makes one revolution, the cleaning fluid from the first cleaning nozzle 121, the cleaning fluid from the second cleaning nozzle 122, and the gas from the blow nozzle 126 impinge on the circumferential surface of the roll sponge 78 in this order to thereby remove the processing debris from the circumferential surface of the roll sponge 78 and further remove the cleaning fluid from the roll sponge 78. Since the self-cleaning device 110 cleans the roll sponge 78 with the high-pressure jet flow of the cleaning fluid in this manner, back contamination of the roll sponge 78 and the wafer does not occur, unlike a conventional contact-type self-cleaning device. Cleaning of the roll sponge 78 may be performed while supplying chemical liquid onto the roll sponge 78.

Figure 5:
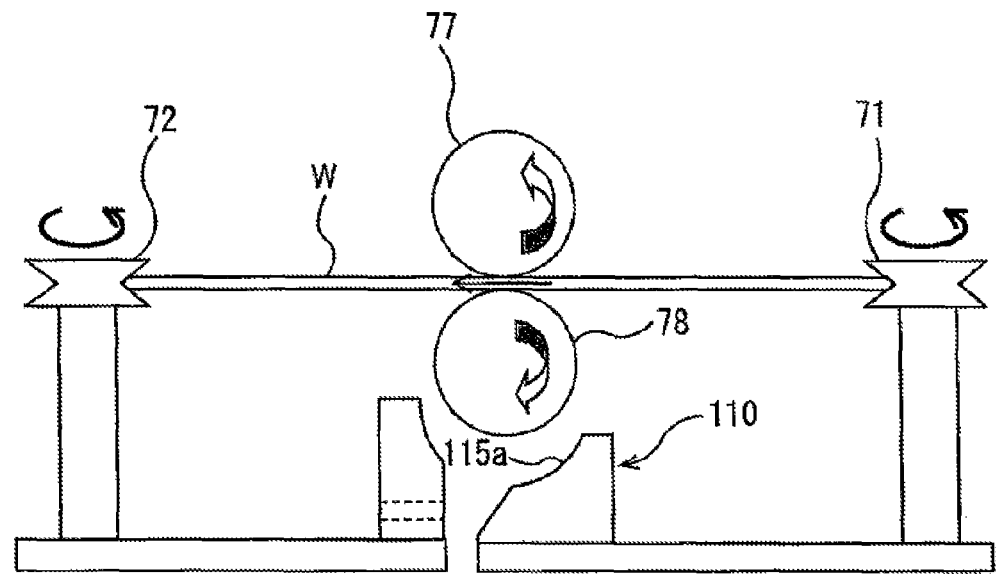
FIG. 5 is a view showing positions of roll sponges when cleaning a wafer.
Figure 6:
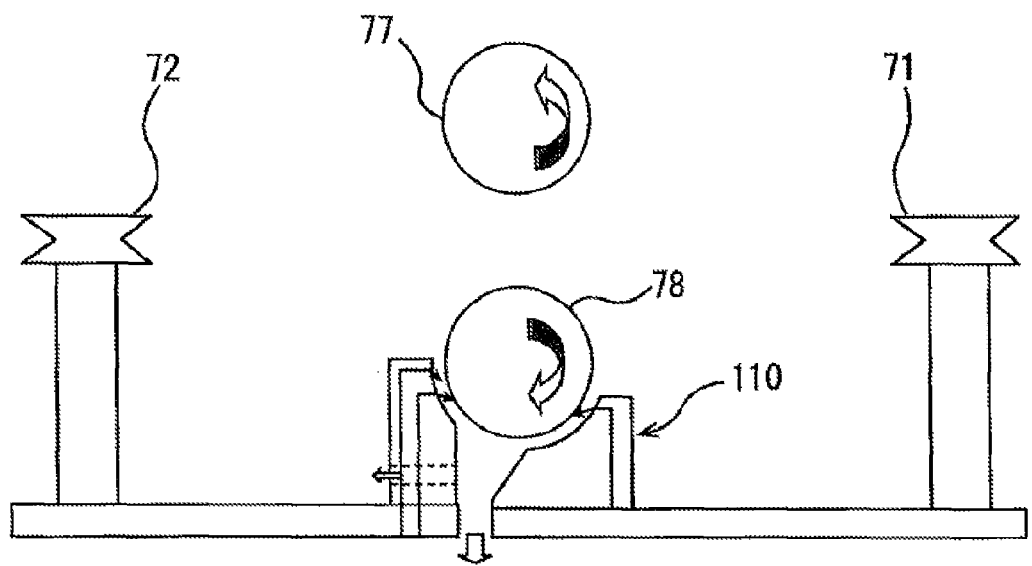
FIG. 6 is a view showing positions of the roll sponges when the self-cleaning device is cleaning the roll sponge.

The roll sponge 78 is configured to be vertically movable by an elevating device (not shown). As shown in FIG. 5, the roll sponge 78 is in an elevated position when cleaning the wafer W. As shown in FIG. 6, the roll sponge 78 is in a lowered position during the cleaning of the roll sponge 78. When the roll sponge 78 is in the lowered position, the approximately uniform gap is formed between the circumferential surface of the roll sponge 78 and the inner circumferential surface 115a of the self-cleaning device 110. Since the self-cleaning device 110 is disposed immediately below the roll sponge 78, the roll sponge 78 can be set in a predetermined cleaning position of the self-cleaning device 110 simply by moving the roll sponge 78 slightly in a downward direction. Therefore, the cleaning process including transporting of the roll sponge 78 can be performed within a shorter time. As a result, a throughput can be improved.

Figure 7:
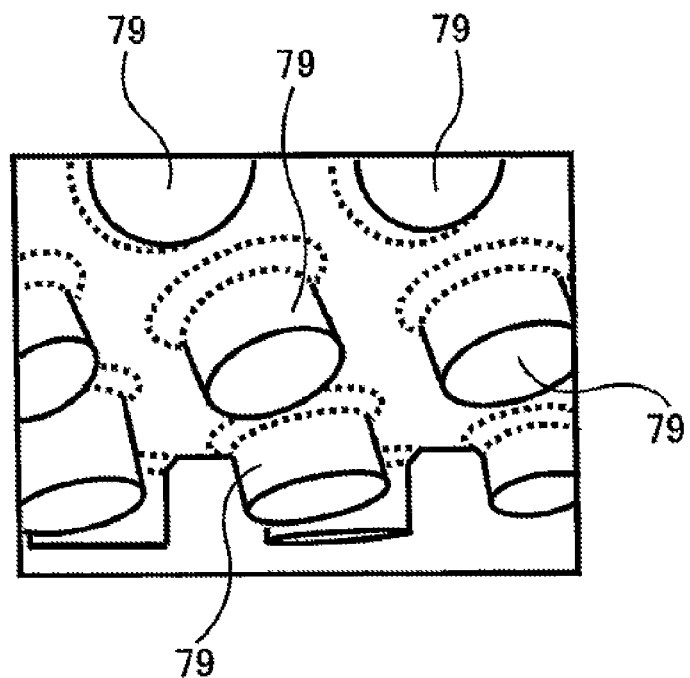
FIG. 7 is a schematic enlarged view of a circumferential surface of the roll sponge.
Figure 8:
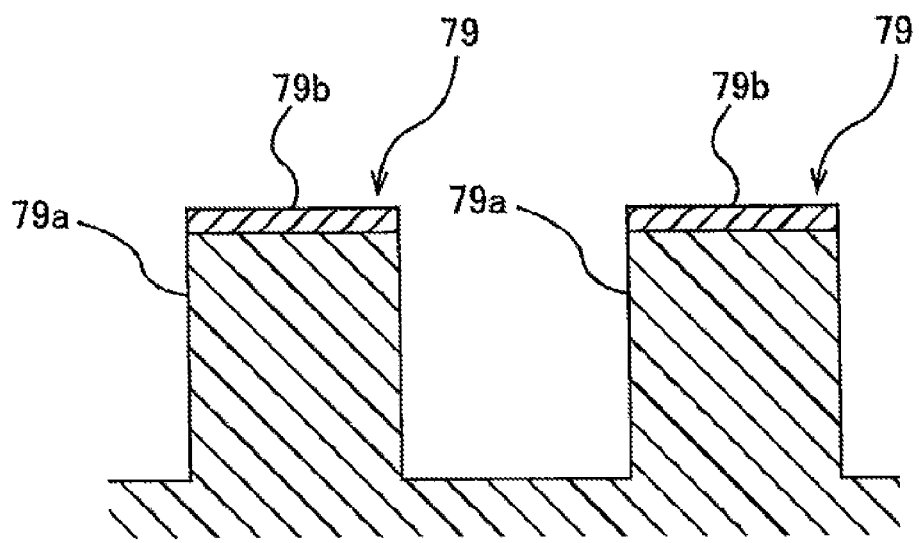
FIG. 8 is a cross-sectional view of protrusions constituting the circumferential surface of the roll sponge.
Figure 9:
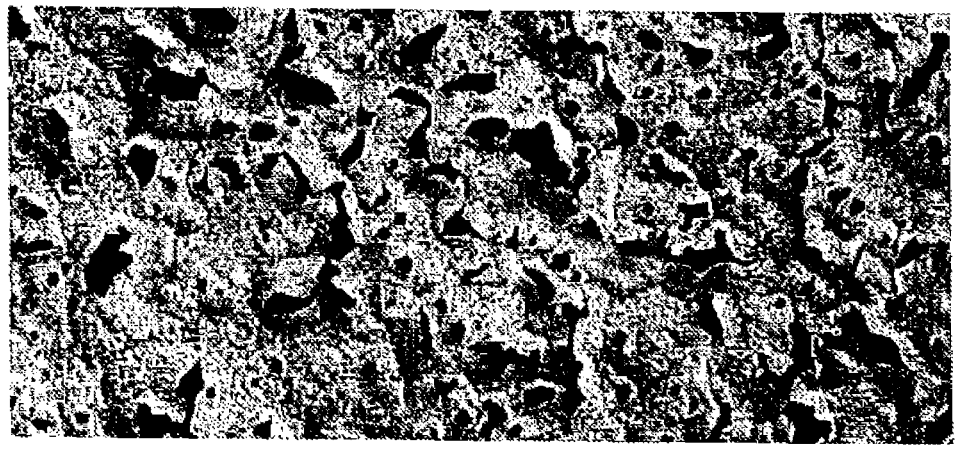
FIG. 9 is an enlarged photograph of an apex of a protrusion.
Figure 10:
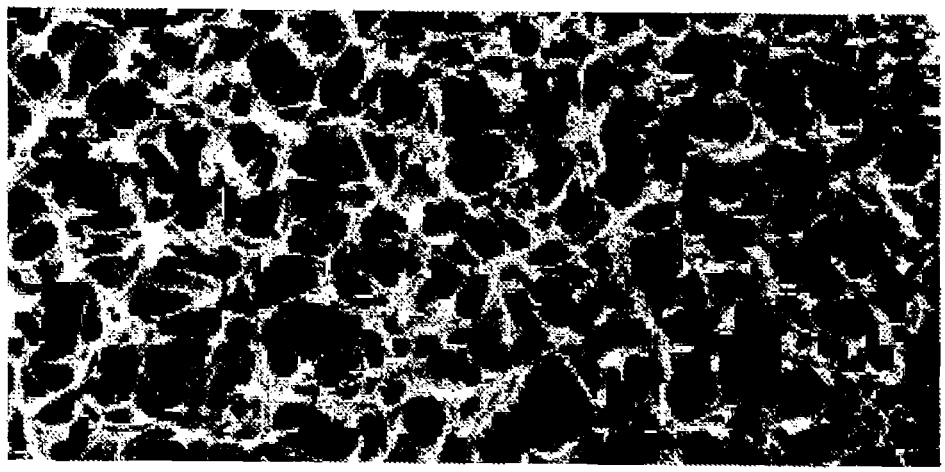
FIG. 10 is an enlarged photograph of a base portion of the protrusion.
Figure 11:
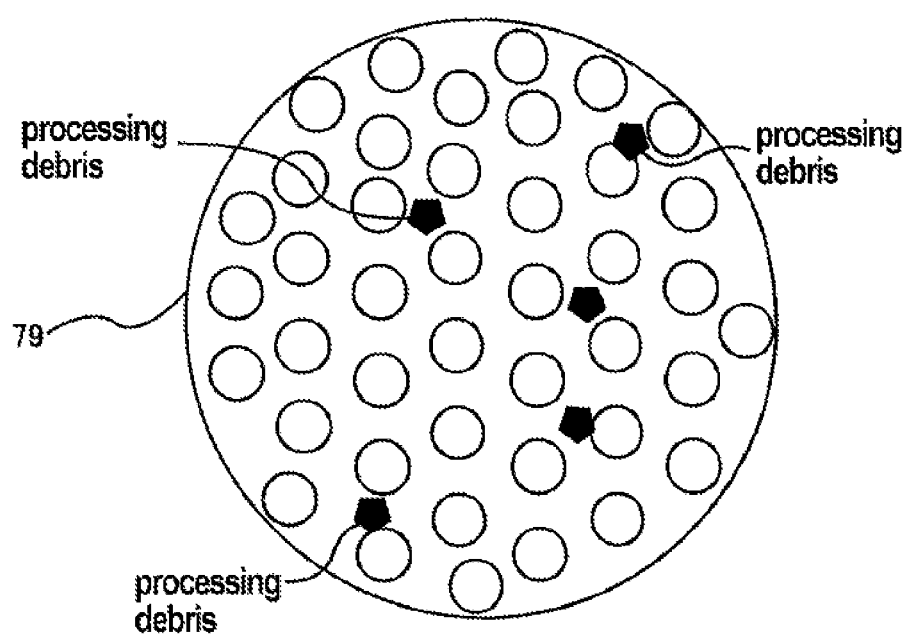
FIG. 11 is a schematic view showing processing debris accumulated in the base portion of the protrusion.

FIG. 7 is a schematic enlarged view of the circumferential surface of the roll sponge 78. As shown in FIG. 7, the circumferential surface of the roll sponge 78 is constituted by a number of protrusions 79. FIG. 8 is a cross-sectional view of the protrusions 79 constituting the circumferential surface of the roll sponge 78. A base portion 79a and an apex 79b of each protrusion 79 are constituted by a resin, a non-woven fabric, or the like. For example, the base portion 79a and the apex 79b can be constituted by PVA (polyvinyl alcohol) sponge. FIG. 9 is an enlarged photograph of the apex 79b of the protrusion 79, and FIG. 10 is an enlarged photograph of the base portion 79a of the protrusion 79. As can be seen from FIG. 9 and FIG. 10, the apex 79b of the protrusion 79 has a high-density structure, while the base portion 79a of the protrusion 79 has relatively large voids formed therein. As a result, as shown in FIG. 11, the processing debris is likely to be accumulated in the base portion 79b of the protrusion 79.

Figure 12:
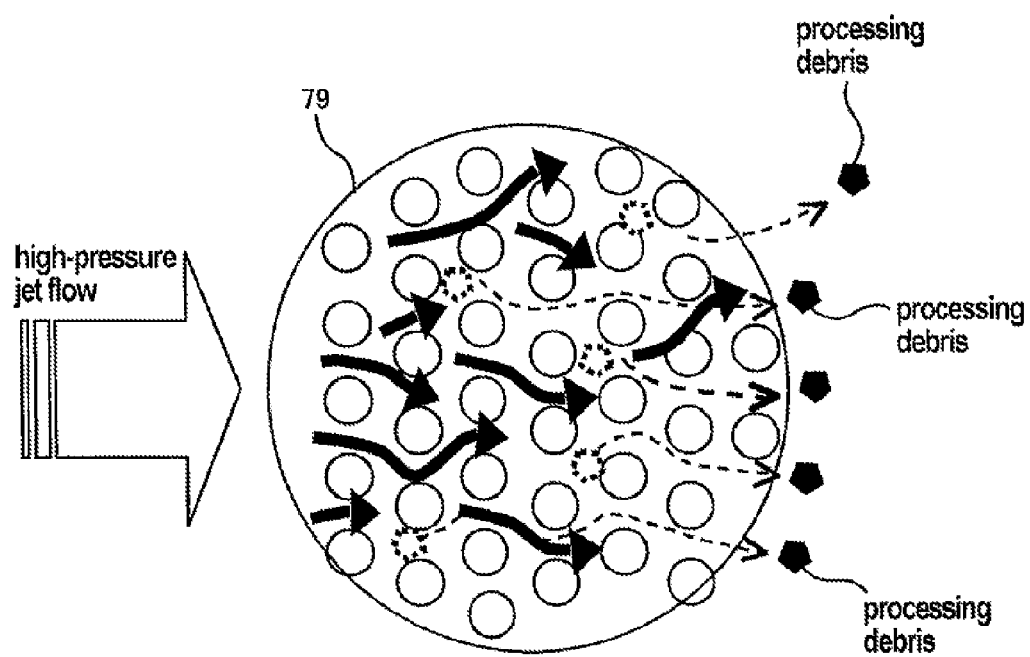
FIG. 12 is a schematic view illustrating a jet flow of a cleaning fluid when removing the processing debris accumulated in the base portion of the protrusion.

The self-cleaning device 110 according to the present embodiment is configured to supply the high-pressure cleaning fluid from substantially a tangential direction of the circumferential surface of the roll sponge 78. Therefore, as shown in FIG. 12, the high-pressure jet flow of the cleaning fluid impinges on each protrusion 79 from a lateral direction, thereby removing the processing debris accumulated in the protrusion 79.

Figure 13:
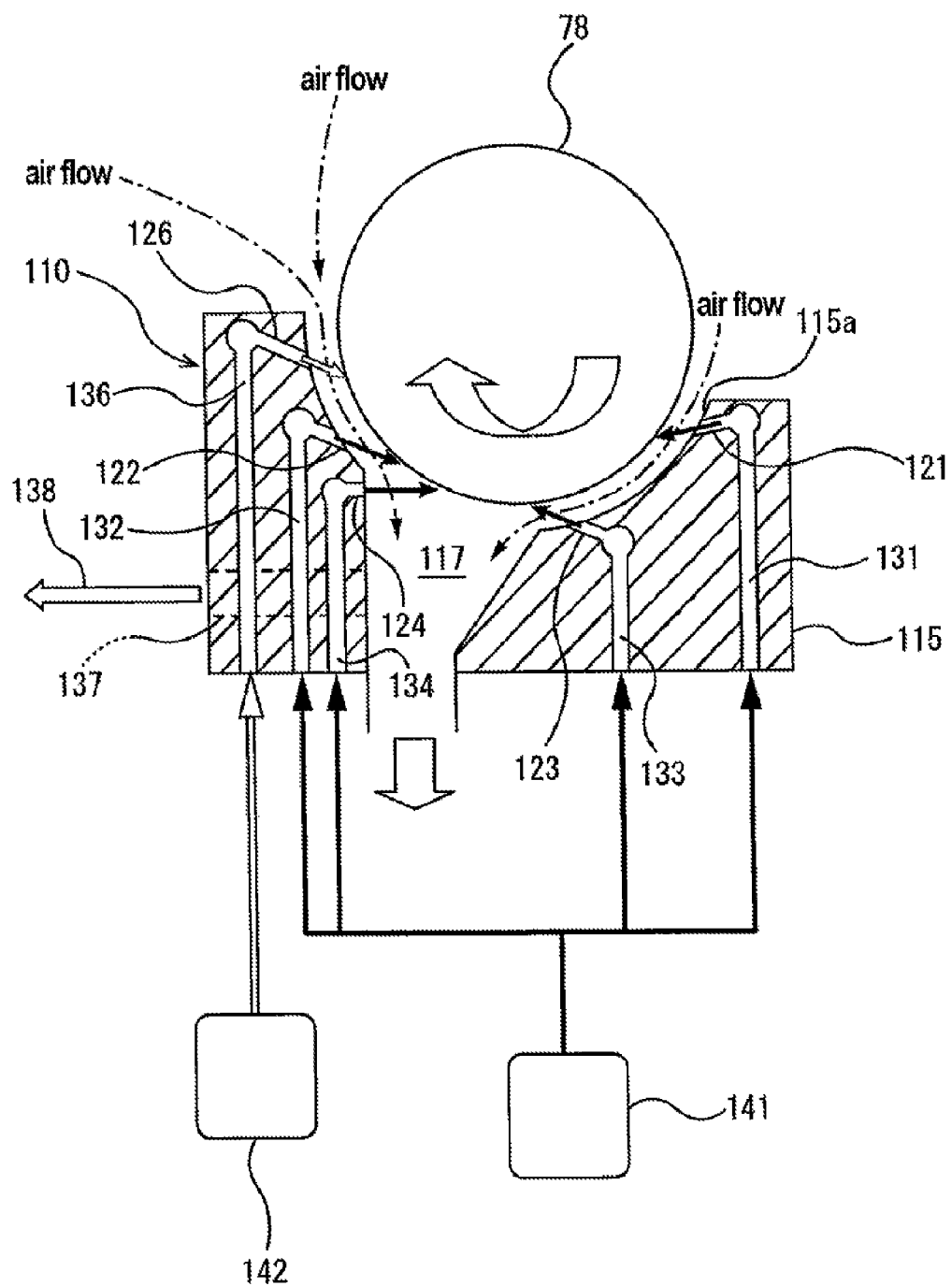
FIG. 13 is a cross-sectional view showing a self-cleaning device in which a third cleaning nozzle is disposed below a first cleaning nozzle, and a fourth cleaning nozzle is disposed below a second cleaning nozzle.

As shown in FIG. 13, a third cleaning nozzle 123 may be disposed below the first cleaning nozzle 121, and a fourth cleaning nozzle 124 may be disposed below the second cleaning nozzle 122. The third cleaning nozzle 123 and the fourth cleaning nozzle 124 are coupled to the above-described cleaning fluid supply source 141 through a third fluid passage 133 and a fourth fluid passage 134, respectively. Each of the third fluid passage 133 and the fourth fluid passage 134 is also constituted by a plurality of slit nozzles which are arranged along the central axis of the roll sponge 78.

The third cleaning nozzle 123 and the fourth cleaning nozzle 124 are disposed at both sides of the roll sponge 78. The third cleaning nozzle 123 is inclined upwardly with respect to the horizontal direction, and the fourth cleaning nozzle 124 is oriented substantially in the horizontal direction. The cleaning fluid, which has been ejected from these cleaning nozzles 123, 124, impinges on the lower part of the circumferential surface of the roll sponge 78 at an acute angle, thereby removing the processing debris from the roll sponge 78.

Figure 14:
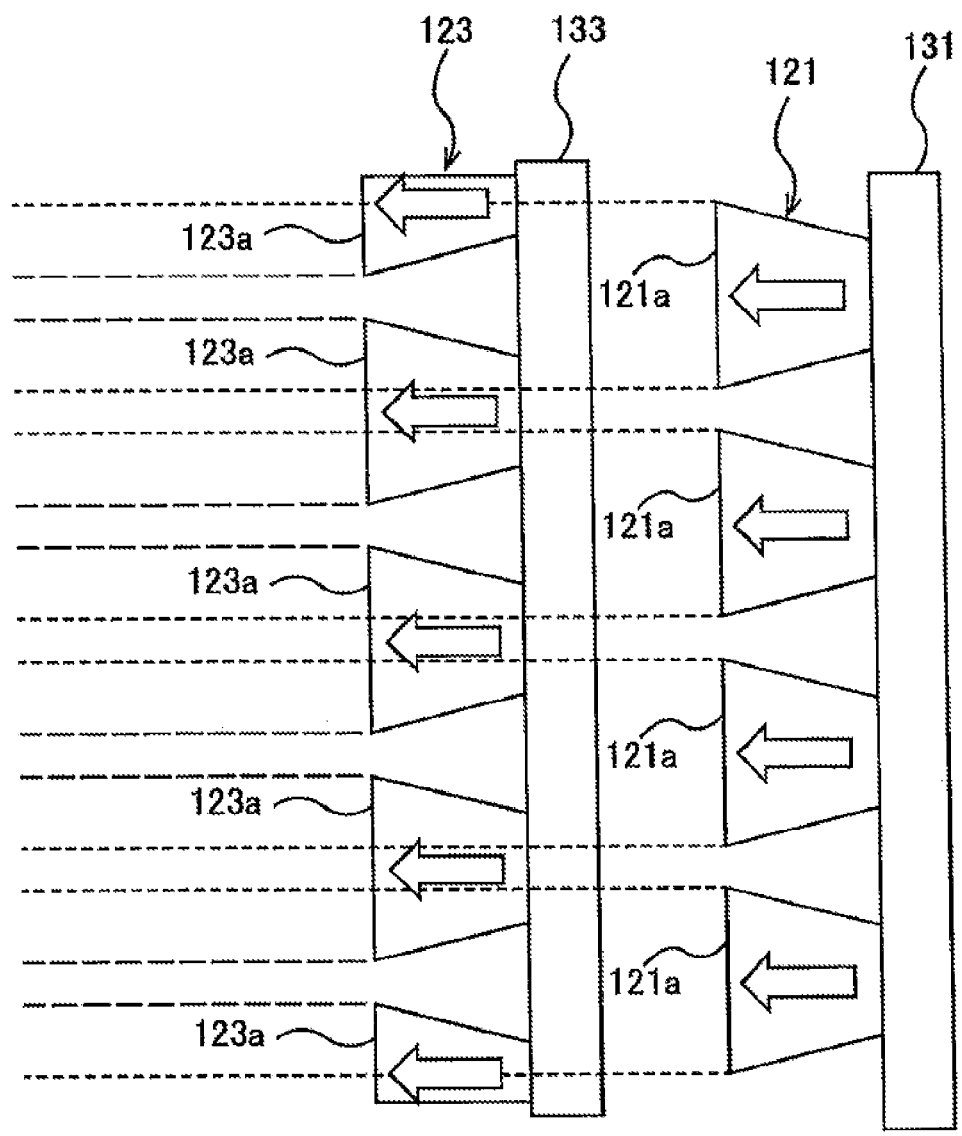
FIG. 14 is a top view schematically showing an arrangement of the first cleaning nozzle and the third cleaning nozzle.
Figure 15:
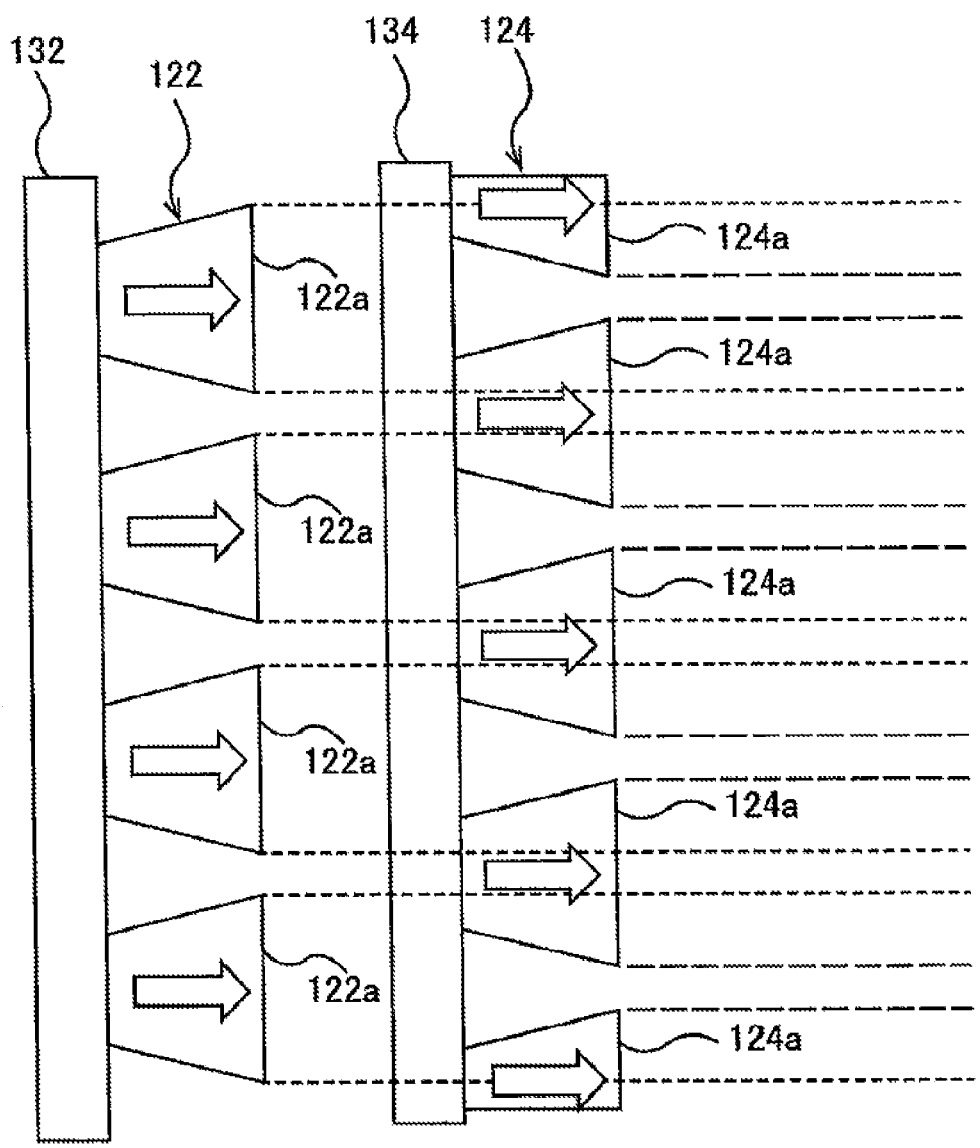
FIG. 15 is a top view schematically showing an arrangement of the second cleaning nozzle and the fourth cleaning nozzle.

FIG. 14 is a top view schematically showing an arrangement of the first cleaning nozzle 121 and the third cleaning nozzle 123. The first cleaning nozzle 121 and the third cleaning nozzle 123 are constituted by plural slit nozzles 121a, 123a, respectively, which are arranged at predetermined intervals along the central axis of the roll sponge 78. This is for the following reasons. If each of the cleaning nozzle 121 and the cleaning nozzle 123 is a long single slit nozzle, the cleaning fluid, which has been ejected from these slit nozzles 121, 123, may interrupt the air flow (see FIG. 13) flowing in the gap between the circumferential surface of the roll sponge 78 and the inner circumferential surface 115a of the cleaning body 115. Furthermore, the cleaning liquid (e.g., pure water), which is contained in the cleaning fluid ejected from the first cleaning nozzle 121, may clog the third cleaning nozzle 123 that is disposed below the first cleaning nozzle 121. In order to avoid such problems, the first cleaning nozzle 121 and the third cleaning nozzle 123 are constituted by the multiple slit nozzles 121a, 123a, respectively. Furthermore, as shown in FIG. 14, the slit nozzles 121a, constituting the first cleaning nozzle 121, and the slit nozzles 123a, constituting the third cleaning nozzle 123, are arranged alternately along the axial direction of the roll sponge 78. For the same reason, as shown in FIG. 15, the second cleaning nozzle 122 and the fourth cleaning nozzle 124 are also constituted by plural slit nozzles 122a, 124a, respectively, which are arranged along the central axis of the roll sponge 78. The slit nozzles 122a, constituting the second cleaning nozzle 122, and the slit nozzles 124a, constituting the fourth cleaning nozzle 124, are arranged alternatively along the axis direction of the roll sponge 78.

Figure 16:
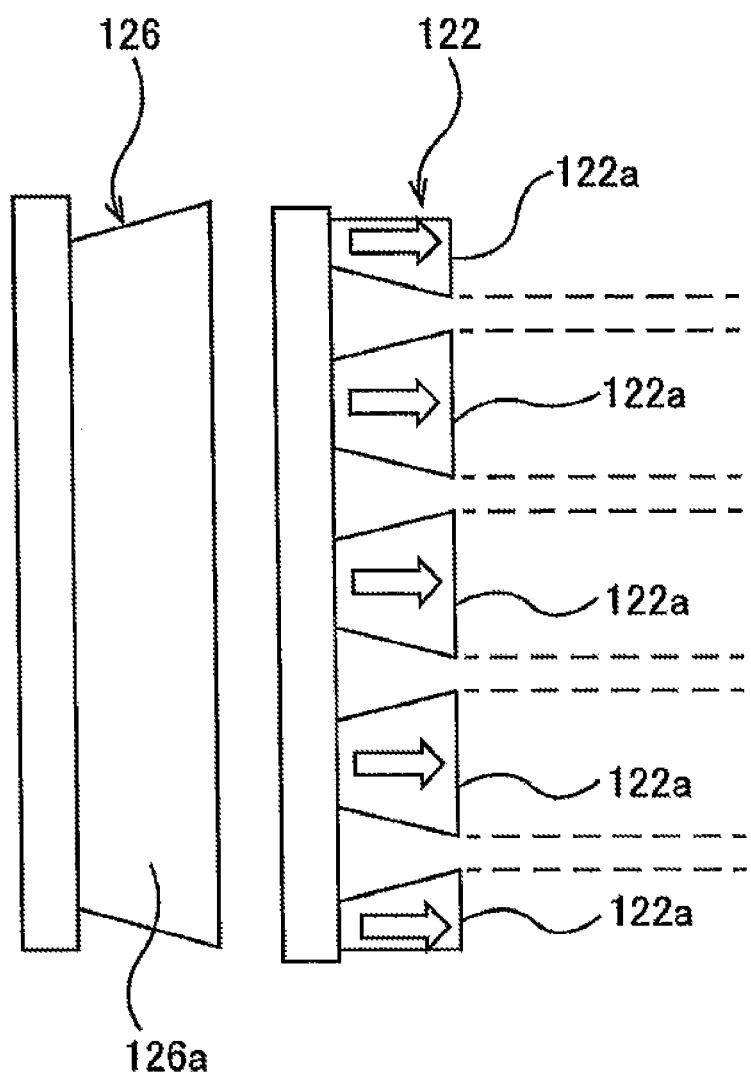
FIG. 16 is a top view schematically showing a blow nozzle constituted by a single slit nozzle.
Figure 17:
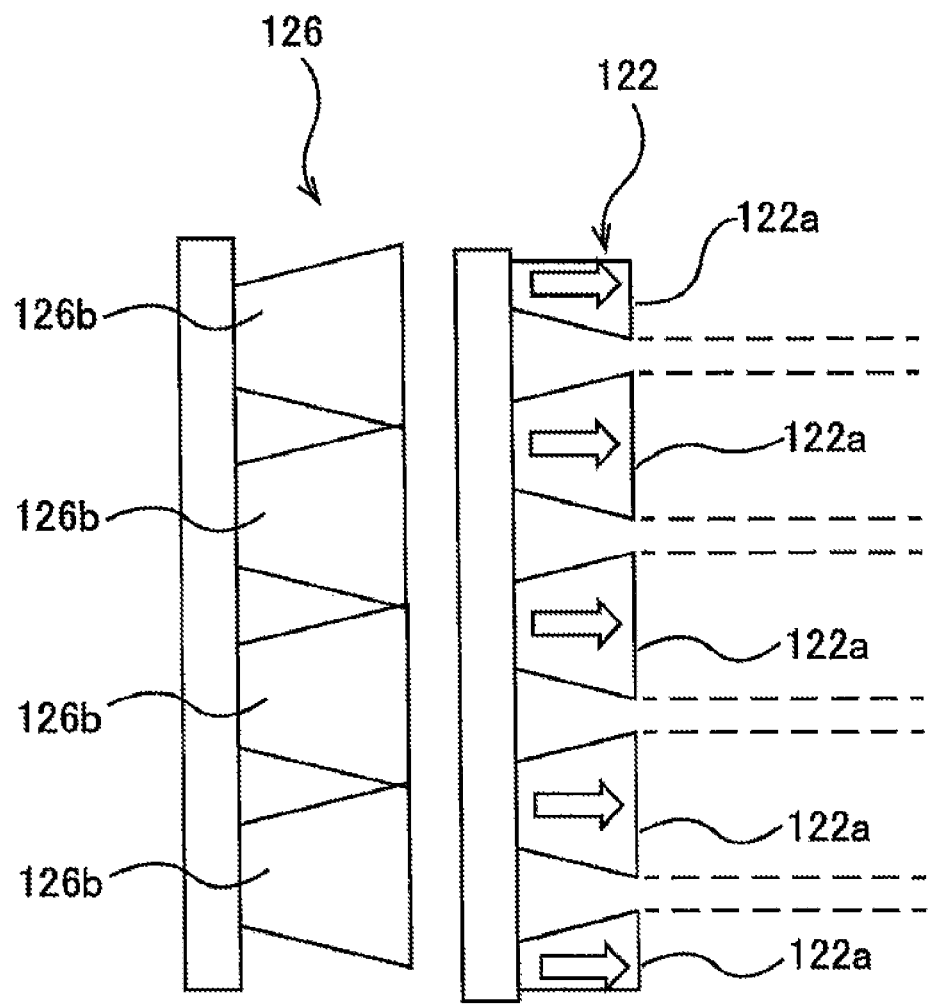
FIG. 17 is a top view schematically showing a blow nozzle constituted by plural slit nozzles.

In contrast, the blow nozzle 126 may be constituted by a single slit nozzle 126a which extends along the central axis of the roll sponge 78 as shown in FIG. 16, or may be constituted by plural slit nozzles 126b which are arranged along the central axis of the roll sponge 78 as shown in FIG. 17.

According to the embodiment shown in FIG. 13, every time the roll sponge 78 makes one revolution, the cleaning fluid from the first cleaning nozzle 121, the cleaning fluid from the third cleaning nozzle 123, the cleaning fluid from the fourth cleaning nozzle 124, the cleaning fluid from the second cleaning nozzle 122, and the gas from the blow nozzle 126 impinge on the circumferential surface of the roll sponge 78 in this order to thereby remove the processing debris from the circumferential surface of the roll sponge 78 and further remove the cleaning fluid from the roll sponge 78.

Although the self-cleaning device 110 for cleaning the lower roll sponge 78 rubbed against the lower surface of the wafer has been explained in the above embodiments, a self-cleaning device for cleaning the upper roll sponge 77 rubbed against the upper surface of the wafer may be provided instead of the self-cleaning device 110 or in addition to the self-cleaning device 110.

FIG. 18 is a schematic view showing the substrate cleaning apparatus including a self-cleaning device 112 for cleaning the upper roll sponge 77 instead of the above-described self-cleaning device 110. As shown in FIG. 18, the self-cleaning device 112 is disposed adjacent to the holding rollers (substrate holder) 71, 72, 73, 74. This substrate cleaning apparatus includes a transporting mechanism 150 for the roll sponge 77, and the transporting mechanism 150 is configured to transport the roll sponge 77 to the self-cleaning device 112 after the roll sponge 77 has finished the cleaning of the wafer. The transporting mechanism 150 is constituted by an air cylinder or a combination of a ball screw mechanism and a servomotor. The self-cleaning device 112 shown in FIG. 18 has the same structure as the above-described self-cleaning device 110.

FIG. 19 is a schematic view showing the substrate cleaning apparatus including the self-cleaning device 112 for cleaning the upper roll sponge 77 in addition to the self-cleaning device 110 for cleaning the lower roll sponge 78. The substrate cleaning apparatus shown in FIG. 19 has the self-cleaning device 110 shown in FIG. 6 and the self-cleaning device 112 shown in FIG. 18. According to the present embodiment, the roll sponges 77, 78, which are rubbed against the both surfaces of the wafer W, can be cleaned. Therefore, the cleanliness of the both surfaces of the wafer W which the roll sponges 77, 78 contact can be enhanced.

From a standpoint of a productivity improvement of devices, a diameter of a wafer tends to increase. Under such tendency, a wafer is expected to have a diameter of 450 mm in the future. A higher cleanliness than ever before is required at a back surface (a surface opposite to a surface on which devices are formed) of the wafer having a large diameter. This is because, if dust or particles are attached to the back surface of the wafer, the wafer placed on a stage of an exposure apparatus is inclined and as a result the exposure apparatus cannot focus a light beam on a surface of the wafer in its entirety. According to the embodiment shown in FIG. 19, the upper and lower roll sponges 77, 78 are kept clean by the corresponding self-cleaning devices 112, 110. Therefore, the upper and lower roll sponge 77, 78 can clean both surfaces of the wafer without causing the back contamination.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate cleaning apparatus, comprising:
   a substrate holder configured to hold and rotate a substrate;
   a cylindrical scrub-cleaning tool configured to come into sliding contact with a surface of the substrate;
   a rotating device configured to rotate the scrub-cleaning tool about its own axis; and
   a self-cleaning device configured to clean the scrub-cleaning tool,
   the self-cleaning device including
      a cleaning body having an inner circumferential surface that is shaped along a circumferential surface of the scrub-cleaning tool,
      at least one cleaning nozzle configured to eject a cleaning fluid toward the circumferential surface of the scrub-cleaning tool through a gap between the circumferential surface of the scrub-cleaning tool and the inner circumferential surface of the cleaning body, and
      a blow nozzle configured to eject a gas toward the circumferential surface of the scrub-cleaning tool through the gap, the blow nozzle being disposed downstream of the cleaning nozzle with respect to a rotational direction of the scrub-cleaning tool.

2. The substrate cleaning apparatus according to claim 1, wherein the at least one cleaning nozzle comprises a first cleaning nozzle and a second cleaning nozzle disposed at both sides of the scrub-cleaning tool.

3. The substrate cleaning apparatus according to claim 1, wherein the cleaning nozzle comprises a plurality of slit nozzles arranged along a central axis of the scrub-cleaning tool.

4. The substrate cleaning apparatus according to claim 1, wherein the cleaning nozzle is inclined downwardly.

5. The substrate cleaning apparatus according to claim 1, wherein the cleaning fluid comprises a mixture of a cleaning liquid and a high-pressure gas.

6. The substrate cleaning apparatus according to claim 1, wherein the cleaning fluid comprises a high-pressure cleaning liquid.

7. The substrate cleaning apparatus according to claim 1, wherein the self-cleaning device further includes a drain having a fluid inlet lying in the inner circumferential surface of the cleaning body.

8. The substrate cleaning apparatus according to claim 1, wherein the scrub-cleaning tool is disposed so as to come into sliding contact with a lower surface of the substrate, and the self-cleaning device is disposed below the scrub-cleaning tool.

9. The substrate cleaning apparatus according to claim 1, further comprising:
   a transporting mechanism configured to transport the scrub-cleaning tool to the self-cleaning device,
   the scrub-cleaning tool being disposed so as to come into sliding contact with an upper surface of the substrate, and
   the self-cleaning device being disposed adjacent to the substrate holder.

10. A substrate cleaning apparatus, comprising:
    a substrate holder configured to hold and rotate a substrate;
    a cylindrical scrub-cleaning tool configured to come into sliding contact with a surface of the substrate;
    a rotating device configured to rotate the scrub-cleaning tool about its own axis; and
    a self-cleaning device configured to clean the scrub-cleaning tool,
    the self-cleaning device including
       a cleaning body having an inner circumferential surface that is shaped along a circumferential surface of the scrub-cleaning tool,
       a first cleaning nozzle and a second cleaning nozzle each configured to eject a cleaning fluid toward the circumferential surface of the scrub-cleaning tool through a gap between the circumferential surface of the scrub-cleaning tool and the inner circumferential surface of the cleaning body, and
       a suction passage for sucking a gas from the gap, the suction passage being located between the first cleaning nozzle and the second cleaning nozzle.

11. A substrate cleaning apparatus, comprising:
    a substrate holder configured to hold and rotate a substrate;
    a cylindrical scrub-cleaning tool configured to come into sliding contact with a surface of the substrate;
    a rotating device configured to rotate the scrub-cleaning tool about its own axis; and
    a self-cleaning device configured to clean the scrub-cleaning tool,
    the self-cleaning device including
       a cleaning body having an inner circumferential surface that is shaped along a circumferential surface of the scrub-cleaning tool, and at least one cleaning nozzle configured to eject a cleaning fluid toward the circumferential surface of the scrub-cleaning tool through a gap between the circumferential surface of the scrub-cleaning tool and the inner circumferential surface of the cleaning body, wherein the at least one cleaning nozzle comprises a first cleaning nozzle and a second cleaning nozzle disposed at both sides of the scrub-cleaning tool, a third cleaning nozzle disposed below the first cleaning nozzle, and a fourth cleaning nozzle disposed below the second cleaning nozzle.

* * * * *